United States Patent
Ding (10) Patent No.: US 7,091,091 B2
(45) Date of Patent: Aug. 15, 2006

(54) NONVOLATILE MEMORY FABRICATION METHODS IN WHICH A DIELECTRIC LAYER UNDERLYING A FLOATING GATE LAYER IS SPACED FROM AN EDGE OF AN ISOLATION TRENCH AND/OR AN EDGE OF THE FLOATING GATE LAYER

(75) Inventor: Yi Ding, Sunnyvale, CA (US)

(73) Assignee: ProMOS Technologies Inc., Hsin Chu (TW)

(*) Notice: Subject to any disclaimer, the term of this patent is extended or adjusted under 35 U.S.C. 154(b) by 39 days.

(21) Appl. No.: 10/879,782

(22) Filed: Jun. 28, 2004

(65) Prior Publication Data

US 2005/0287741 A1    Dec. 29, 2005

(51) Int. Cl.
*H01L 21/336* (2006.01)
(52) U.S. Cl. ............ 438/265; 438/657; 257/E21.684
(58) Field of Classification Search ............ None
See application file for complete search history.

(56) References Cited

U.S. PATENT DOCUMENTS

| | | | |
|---|---|---|---|
| 5,940,717 A | 8/1999 | Rengarajan et al. | 438/435 |
| 6,127,215 A | 10/2000 | Joachim et al. | 438/224 |
| 6,130,129 A | 10/2000 | Chen | 438/257 |
| 6,200,856 B1 | 3/2001 | Chen | 438/257 |
| 6,222,225 B1 | 4/2001 | Nakamura et al. | 257/315 |
| 6,228,713 B1 | 5/2001 | Pradeep et al. | 438/257 |
| 6,319,794 B1 | 11/2001 | Akatsu et al. | 438/424 |
| 6,323,085 B1 | 11/2001 | Sandhu et al. | 438/257 |
| 6,355,524 B1 | 3/2002 | Tuan et al. | 438/257 |
| 6,376,877 B1 | 4/2002 | Yu et al. | 257/317 |
| 6,417,047 B1 | 7/2002 | Isobe | 438/258 |
| 6,448,606 B1 | 9/2002 | Yu et al. | 257/315 |
| 6,518,618 B1 | 2/2003 | Fazio et al. | 257/315 |
| 6,555,427 B1 | 4/2003 | Shimizu et al. | 438/238 |
| 6,562,681 B1 | 5/2003 | Tuan et al. | 438/257 |
| 6,649,472 B1 | 11/2003 | Hsieh | 438/257 |
| 6,743,675 B1 | 6/2004 | Ding | |
| 2002/0072197 A1* | 6/2002 | Kang et al. | 438/424 |
| 2003/0068859 A1 | 4/2003 | Leung et al. | |

(Continued)

FOREIGN PATENT DOCUMENTS

JP    2000-174242    6/2000

(Continued)

OTHER PUBLICATIONS

Keeney, Stephen N., A 130nm Generation High Density Extox™ Flash Memory Technology, Intel Corporation, Santa Clara, California, USA, 42 sheets, no date.

(Continued)

*Primary Examiner*—Chandra Chaudhari
(74) *Attorney, Agent, or Firm*—Michael Shenker; MacPherson Kwok Chen & Heid LLP (57) ABSTRACT

A first dielectric (120) and a first floating gate layer (130.1) are formed on a semiconductor substrate (110). The first dielectric, the first floating gate layer, and the substrate are etched to form isolation trenches (150). The first dielectric (120) is etched to pull the first dielectric away from the trench edges (150E) and/or the edges of the first floating gate layer (130E). The trench edges and/or the edges of the first floating gate layer are then oxidized. The trenches are filled with a second dielectric (210.2), which is then etched laterally adjacent to the edges of the trench and the first floating gate layer. A second floating gate layer (130.2) is formed to extend into the regions which were occupied by the second dielectric before it was etched.

20 Claims, 7 Drawing Sheets

U.S. PATENT DOCUMENTS

2004/0065937 A1    4/2004   Hsiao

OTHER PUBLICATIONS

Aritome, S. et al., "A 0.67µm$^2$ Self-Aligned Shallow Trench Isolation Cell (SA-STI Cell) For 3V-only 256 Mbit NAND EEPROMs," International Electron Devices meeting 1994, San Francisco, CA, Dec. 11-14, 1994, pp. 94-61-94-64.

Silicon, Flash And Other Non-Volatile Memory Technologies, http://www.intel.com/research/silicon/flash.htm, Sep. 12, 2002, pp. 1-4.

U.S. Appl. No. 10/772,520 filed Feb. 4, 2004, by Chua-Shun Hsiao et al.

U.S. Appl. No. 10/678,317 filed Oct. 3, 2003 by Yi Ding.

Shimizu, K. et al. "A Novel High-Density 5F2 NAND STI Cell Technology Suitable for 256 Mbit and 1 Gbit Flash Memories" Microelectronics Engineering Laboratory, TOSHIBA Corporation, 1997 IEEE 11.1.1-11.1.4.

\* cited by examiner

FIG. 9A
ARRAY

FIG. 9B
PERIPHERY

FIG. 10
ARRAY

FIG. 11
ARRAY

FIG. 12A
ARRAY

FIG. 12B
PERIPHERY

FIG. 13
ARRAY

FIG. 14
PERIPHERY

FIG. 15
PERIPHERY

NONVOLATILE MEMORY FABRICATION METHODS IN WHICH A DIELECTRIC LAYER UNDERLYING A FLOATING GATE LAYER IS SPACED FROM AN EDGE OF AN ISOLATION TRENCH AND/OR AN EDGE OF THE FLOATING GATE LAYER

BACKGROUND OF THE INVENTION

The present invention relates to integrated circuits, and more particularly to nonvolatile memories.

FIGS. 1–4 illustrate a nonvolatile memory fabrication process described in U.S. Pat. No. 6,555,427 issued Apr. 29, 2003 to Shimizu et al. These figures show vertical cross sections of the memory structures. A P-well is formed in a semiconductor substrate 110. Tunnel dielectric 120 is formed on substrate 120 on the P-well. First conductive layer 130.1 is formed on dielectric 120 to provide portions of floating gates for the memory cells. A masking layer 140 is formed on layer 130.1. Layers 140, 130.1, 120 and substrate 110 are etched to form isolation trenches 150. The sidewalls of trenches 150 and the layer 130.1 are oxidized, and dielectric 210 is deposited over the structure. Dielectric 210 is subjected to an etch or chemical mechanical polishing (CMP) to expose the top surface of masking layer 140.

Figure 1:
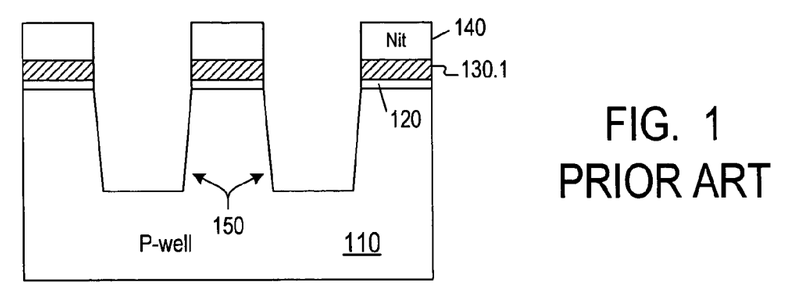
FIGS. 1–4 are cross section illustrations of memory structures in the process of fabrication according to prior art.
Figure 2:
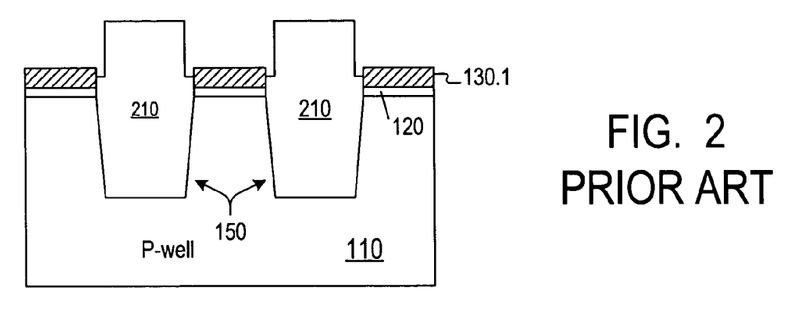

Layer 140 is removed. An isotropic etch of dielectric 210 laterally recesses the dielectric sidewalls away from the floating gate portions 130.1, widening the empty areas above these floating gate portions.

Second conductive layer 130.2 (FIG. 3) is deposited over the structure to provide second portions of the floating gates 130. Layer 130.2 is etched or polished to expose the dielectric 210. A planar top surface is provided. Then dielectric 210 is etched down to expose sidewalls of layer 130.2.

Inter-gate dielectric 410 (FIG. 4) and control gate layer 420 are formed over the structure to finish the memory cell fabrication.

Figure 3:
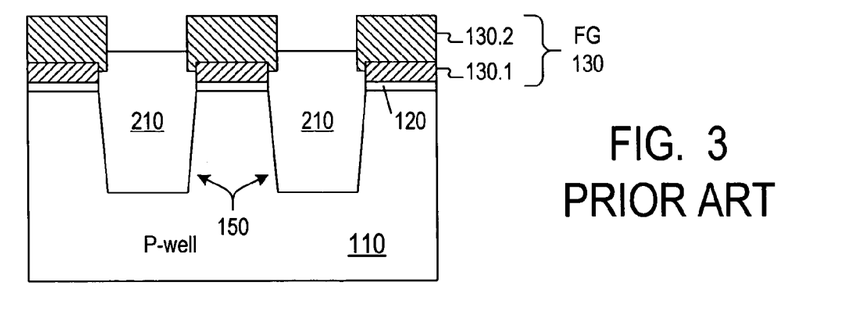

The memory cells are programmed by injecting a negative charge (electrons) into their floating gates 130. The cells are erased by removing the negative charge from the floating gates. The cells are read by sensing the charge on the floating gates. These operations require a voltage $V_{FG.S}$ to be induced between the floating gate (FG) 130 and a region of substrate 110. The voltage $V_{FG.S}$ is induced by establishing a voltage $V_{CG.S}$ between the control gate (CG) 420 and the substrate region, as the control gate is capacitively coupled to the floating gate. In order to reduce the maximum voltage $V_{CG.S}$ needed to induce a given voltage $V_{FG.S}$, one has to increase the "gate coupling ratio" $C_{CG.FG}/C_{FG.S}$, where $C_{CG.FG}$ is the capacitance between control gate 420 and floating gate 130, and $C_{FG.S}$ is the capacitance between the floating gate 130 and the substrate region. The isotropic etch of dielectric 210 (FIG. 2) serves to increase $C_{CG.FG}$ due to the increased width of the top floating gate portions 130.2 (FIG. 3). The etch-back of dielectric 210 (FIG. 3) to expose the sidewalls of layer 130.2 further increases the capacitance $C_{CG.FG}$ by increasing the capacitive coupling between the sidewalls of layer 130.2 and the control gate 420.

SUMMARY

This section summarizes some features of the invention. Other features are described in the subsequent sections. The invention is defined by the appended claims which are incorporated into this section by reference.

Figure 4:
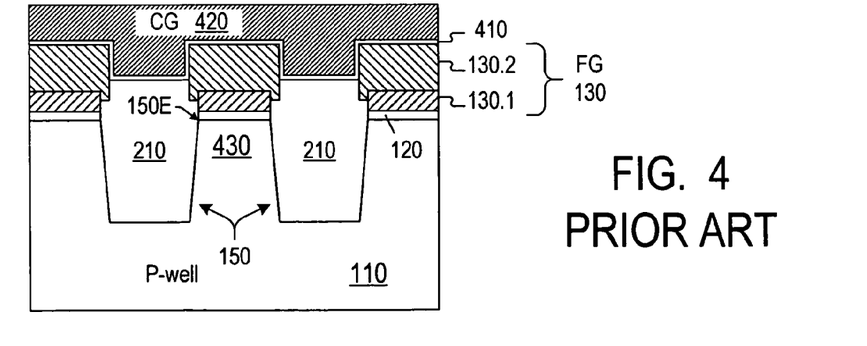

The inventor has observed that the isotropic etch of dielectric 210 (FIG. 2) may increase the sub-threshold current leakage near the trench edges 150E (FIG. 4). Indeed, the dielectric is etched both laterally and vertically, and the etch may expose the substrate 110 and cause a short between the floating gate layer 130.2 and the substrate. Even if the short is avoided, the electric field between the floating gate 130 and substrate 110 will be increased at the edges 150E, thus increasing the leakage current in the off state of the floating gate transistor. This condition can be somewhat alleviated by increasing the thickness of layer 130.1, but this is undesirable because of the increased aspect ratio of the holes into which the dielectric 210 is deposited (the holes formed by trenches 150 and the layers 120, 130.1, 140).

In some embodiments of the present invention, tunnel dielectric 120 is etched laterally after the formation of trenches 150 before the deposition of dielectric 210. This etch pulls back the dielectric 120 away from the trench edges 150E. When the structure is later oxidized, the edges 150E become rounded. Therefore, the electric field will be reduced at the edges. In addition, the bottom edges of layer 130.1 will be oxidized, providing an additional oxide thickness between the layer 130.1 and the trench edges. This additional oxide serves both to reduce the electric field at the trench edges 150E and to increase the data retention time.

In some embodiments, the lateral etch of dielectric 120 is also performed in the peripheral area to round the trench edges in the periphery and thus reduce the electric field at the trench corners and the leakage current. This may be especially desirable for high voltage transistors. In some embodiments, the lateral etch of dielectric 120 is performed in the high voltage peripheral area but not in the low voltage peripheral area. In other embodiments, dielectric 120 is etched both in the high voltage and the low voltage peripheral areas.

The invention is not limited to the features described above. In some embodiments, the dielectric 120 is removed at the edge of the trench but not at the edge of layer 130.1 (the two edges are not always vertically aligned), or the dielectric 120 may be removed at the edge of layer 130.1 but not at the edge of the trench. The invention is applicable to many memory architectures, such as described in U.S. Pat. No. 6,355,524 issued Mar. 12, 2002 to Tuan et al., U.S. Pat. No. 6,417,047 issued Jul. 9, 2002 to Isobe, the aforementioned U.S. Pat. No. 6,555,427, and other architectures, known or to be invented. Other features and advantages of the invention are described below. The invention is defined by the appended claims.

DESCRIPTION OF SOME EMBODIMENTS

The embodiments described in this section illustrate but do not limit the invention. The invention is not limited to particular materials, process steps, or dimensions. The invention is defined by the appended claims.

Figure 5A:
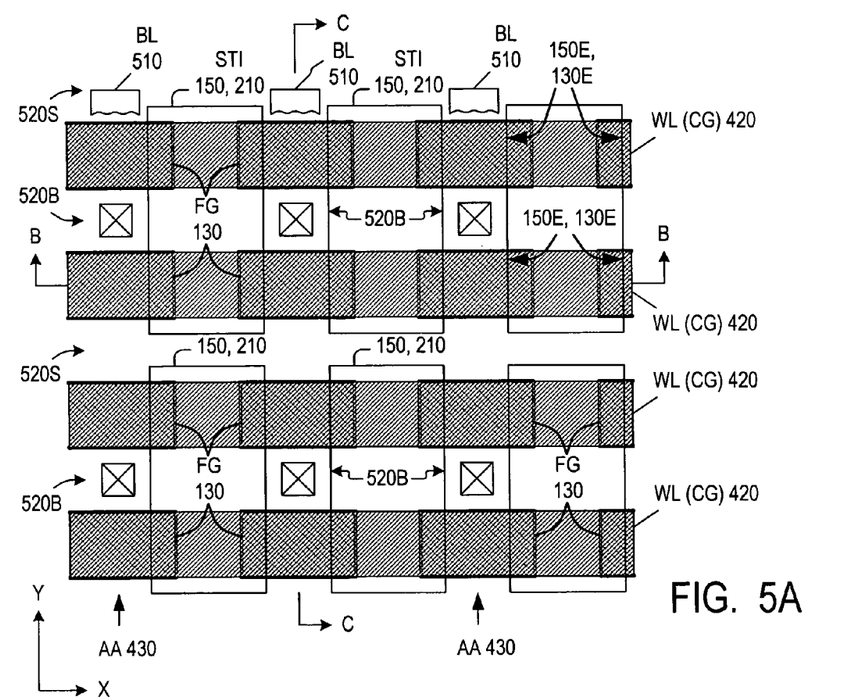
FIG. 5A is a top view of a memory structure fabricated according to one embodiment of the present invention.
Figure 5B:
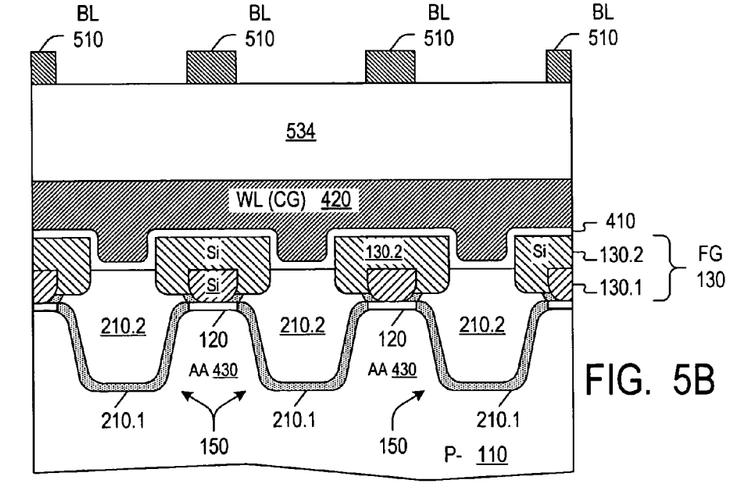
FIGS. 5B, 5C, 6–8, 9A, 9B, 10, 11, 12A, 12B, 13–15, 16, 17A are cross section illustrations of memory structures in the process of fabrication according to embodiments of the present invention.
Figure 5C:
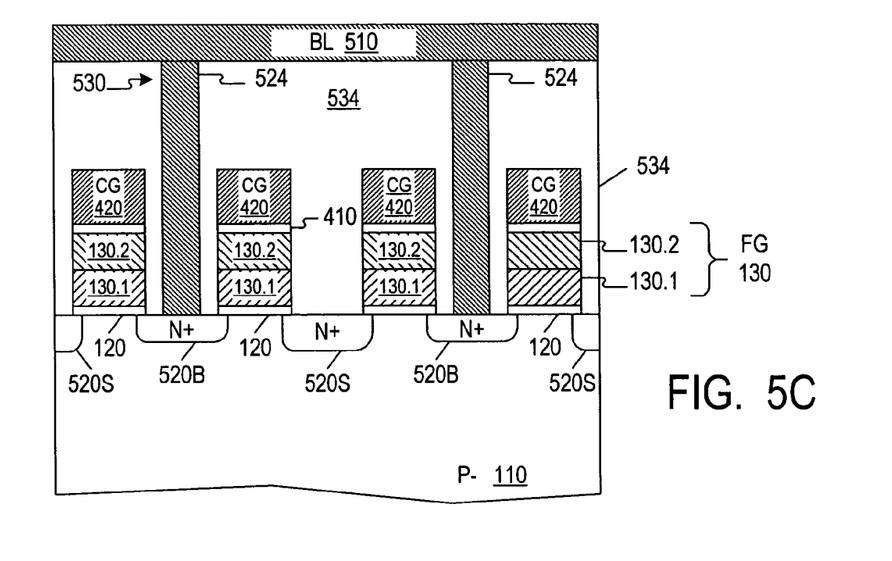

One embodiment of the present invention will now be illustrated on the example of a NOR type flash memory array shown in FIGS. 5A (top view), 5B (vertical cross section marked B—B in FIG. 5A), 5C (vertical cross section marked C—C in FIG. 5A). Wordlines (control gate lines) 420 run in the X direction (row direction) through the array. Bitlines 510 run in the Y direction (column direction) over active areas 430. Each memory cell includes N+ doped source/drain regions 520S, 520B (FIGS. 5A, 5C) formed in active area 430 in substrate 110 on different sides of the floating gate 120. The cell also includes a P type channel region underlying the floating gate and extending between the source/drain regions 520S, 520B in the Y direction. Each region 520S, 520B is shared by two adjacent cells in the column (except possibly the first and last cells of the column, or the first and last cells of a block of cells in the column). "Bitline" regions 520B in each column are connected to a bitline 510 via plugs 524 (FIG. 5C) formed in contact openings 530 etched in dielectric 534. "Source line" regions 520S in each row are part of a source line 520S formed as an N+ type region of substrate 110 and running through the array in the X direction. Each isolation trench 150 passes in the column direction under two wordlines 420 and terminates at source lines 520S. This architecture is exemplary and not limiting.

FIGS. 6–15 show vertical cross sections of intermediate structures during the memory fabrication in the memory array and peripheral areas. The array cross sections are along the line B—B (FIG. 5A). In this example, substrate 110 is monocrystalline silicon. The memory is fabricated in and over a P-type well in substrate 110. Tunnel dielectric 120 (e.g. silicon dioxide) is thermally grown on the substrate to a thickness of 7~10 nm (7 to 10 nm). The materials and dimensions are exemplary and not limiting. The dimensions given below are believed to be suitable for a minimal photolithographic line width of 0.18 μm unless noted otherwise. (No representation is made that experimentation has been conducted and the dimensions were found suitable. Also, as known in the art, the dimensions may have to be adjusted for a particular fabrication technology.) Polysilicon 130.1 is deposited on oxide 120 to an exemplary thickness of 500~900 Å, and is doped during or after deposition. Silicon nitride 140 is deposited on polysilicon 120 to an exemplary thickness of 900~2000 Å. A photoresist layer (not shown) is deposited on nitride 140 and patterned to define the trenches 150. Nitride 140, polysilicon 130.1, oxide 120 and substrate 110 are etched anisotropically to form the trenches. Active areas 430 (substrate areas not occupied by the trenches) become also defined as a result. If desired, before the etch of oxide 120, the nitride 140 and/or polysilicon 130.1 can be etched laterally to reduce the floating gate dimensions.

Figure 6:
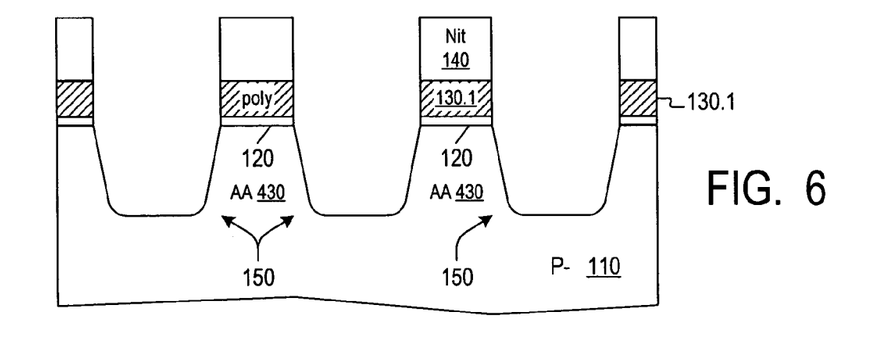

In some embodiments, isolation trenches are also created in the peripheral area for peripheral circuitry (i.e. address and data buffers, sense amplifiers, address decoders, voltage generators, clock generators, and possibly other circuitry needed to access the memory). The peripheral trenches can be formed simultaneously with the array trenches or in separate steps (to provide a different trench depth, for example). Thus in some embodiments, FIG. 6 represents both the array and the peripheral area.

Figure 7:
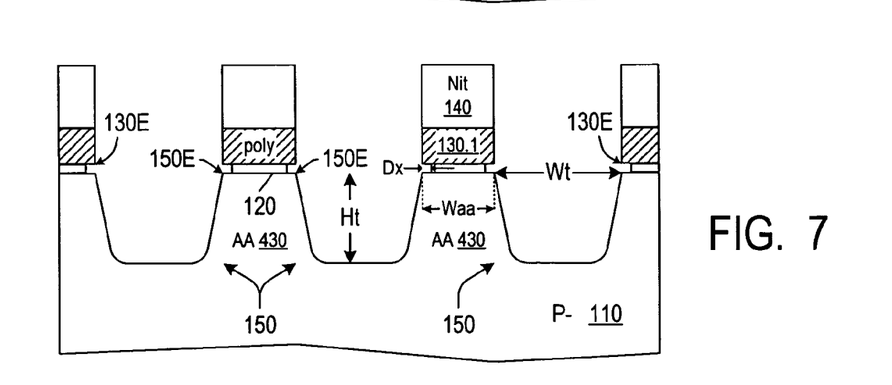

As shown in FIG. 7, tunnel oxide 120 is laterally etched under the polysilicon 130.1 to pull the oxide 120 away from trench edges 150E and from bottom edges 130E of polysilicon 130.1. In some 0.18 μm line width embodiments, the trench width Wt is 0.26 μm at the top of substrate 110, the active area width Waa is 0.22 μm at the top of substrate 110, and the oxide 120 is pulled back by a distance Dx=100 Å from trench edges 150E and polysilicon edges 130E. The trench depth Ht=0.2 μm (measured from the top surface of substrate 120). In one 0.12 μm line width embodiment, Wt=0.18 μm, Waa=0.14 μm, Dx=50 Å, Ht=0.16 μm. At the conclusion of the etch, the horizontal bottom surface of polysilicon features 130.1 overhangs the edges of oxide 120. Edges 130E of the horizontal bottom surface of features 130.1 overlie the trench edges 150E. This geometry and dimensions are exemplary and not limiting. For example, the overhanging bottom surface of features 130.1 is not horizontal in some embodiments.

The oxide etch can be a wet etch (isotropic) selective to silicon, e.g. a buffered oxide etch or an HF etch.

In some embodiments, the peripheral area is masked during this etch. In other embodiments, the periphery is exposed for the etch, so FIG. 7 also represents the periphery. In some embodiments, the periphery is masked except for a high voltage area. The high voltage area is an area for the transistors generating super high voltages needed for programming and erasing the memory. The super high voltages have higher magnitudes than the voltages needed for reading the memory.

If photoresist was used to mask any part of the wafer, the photoresist is removed. The structure is oxidized (see FIG. 8) to grow a silicon dioxide layer 210.1 on the exposed surfaces of substrate 110 and polysilicon 130.1. Exemplary oxidation processes include RTO (rapid thermal oxidation) and oxidation in an oven. In one embodiment, the oxidation is performed in a dry atmosphere at 900~1080° C. to grow 100~150 Å of silicon dioxide 210.1 on substrate 120. The oxide thickness on polysilicon 130.1 may be larger and will depend on the polysilicon doping type and dopant concentration. In some embodiments, the oxide thickness on the polysilicon sidewalls is 200~300 Å. The oxidation rounds the trench edges 150E and the polysilicon bottom edges 130E. If these edges were sharp, they become rounded. If the edges were already rounded, they become more rounded. The rounded profile of trench edges 150E will reduce the electric field at these edges.

Figure 8:
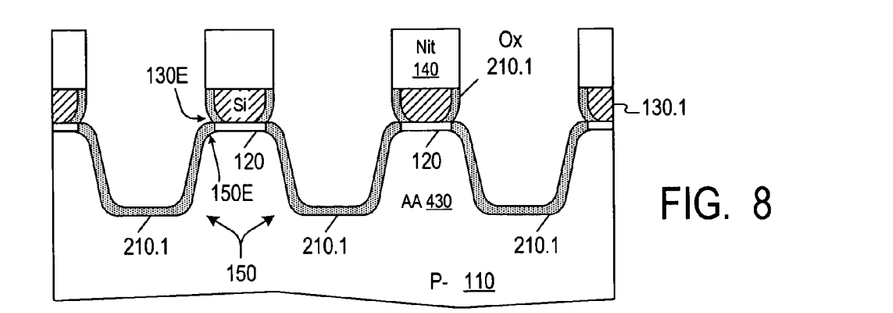

The oxidation step is also performed in the periphery.

Dielectric 210.2 (FIG. 9A) is formed over the structure to fill the trenches, and is processed by CMP and/or etch-back to expose the nitride 410 and provide a planar top surface.

Figure 9A:
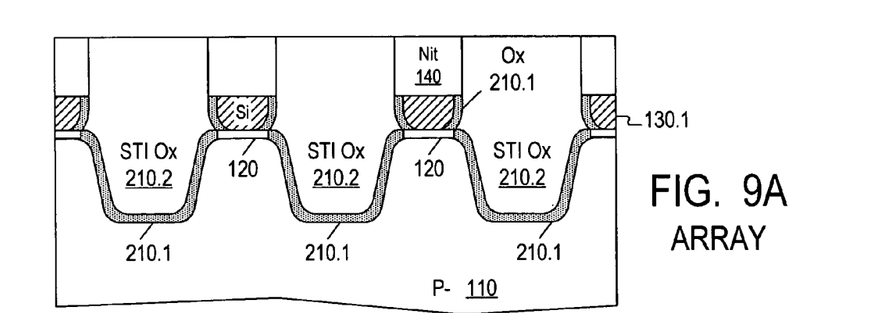
Figure 9B:
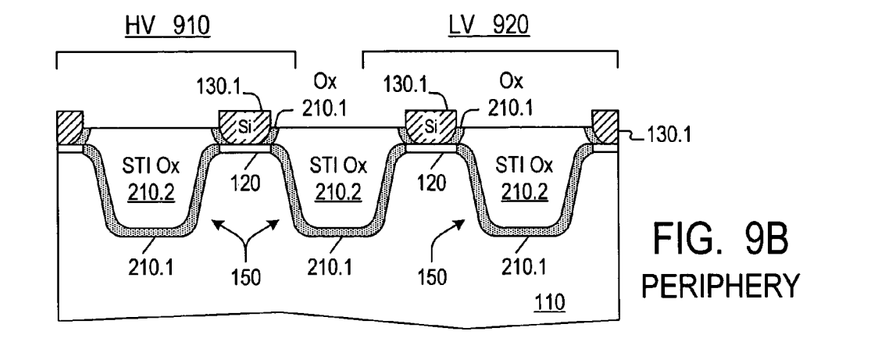
Figure 10:
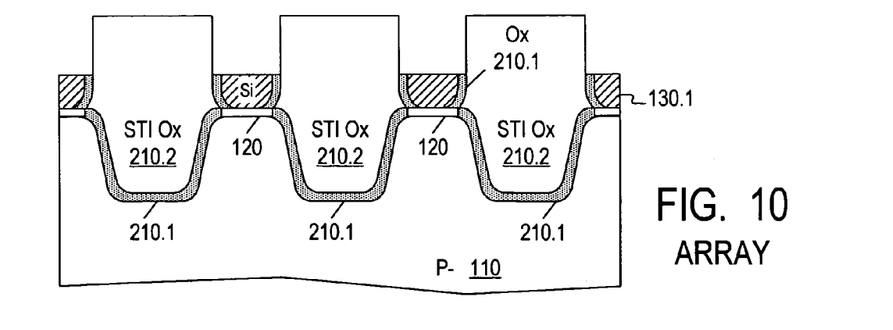

Optionally, the array is masked with photoresist (not shown), and the oxide 210.2, 210.1 is etched down in the periphery. See FIG. 9B, showing a high voltage peripheral area 910 and a low voltage peripheral area 920. (In this embodiment, the lateral etch of oxide 120 of FIG. 7 was performed both in area 910 and in area 920.) The etch of oxide 210.1, 210.2 will make it easier to pattern the peripheral transistor gates.

The resist masking the array is removed. Nitride 140 is removed in the array and the periphery (by a wet etch, for example). See FIG. 10. Then the periphery is masked with photoresist (not shown), and portions of oxide layers 210.1, 210.2 are removed in the array area adjacent to sidewalls of polysilicon features 130.1 (see FIG. 11) to form pocket regions 1110 at the sidewalls of the polysilicon features. The sidewalls of polysilicon 130.1 are exposed in these pockets. The pockets can be formed by an isotropic wet etch of oxide 210.1, 210.2 without masking any part of the array area. The lateral component of the etch causes the sidewalls of oxide 210.2 to be laterally recessed in the direction away from the adjacent polysilicon features 130.1 and active areas 430. In some embodiments, the top sidewall portions 210T of oxide 210.2 become positioned over trenches 130, while the lower sidewall portions of oxide 210.2 continue to overlap the active areas. In one embodiment, the isotropic etch laterally recesses the sidewall by an amount Ls in the range of 0.03 µm to 0.05 µm. The depth Ds of each pocket 1110 (measured from the top surface of polysilicon 130.1) is equal to Ls if the etch is isotropic. The etch also lowers the top surface of oxide 210.2. An anisotropic etch can also be used, to provide a Ds value different from Ls if desired.

Figure 11:
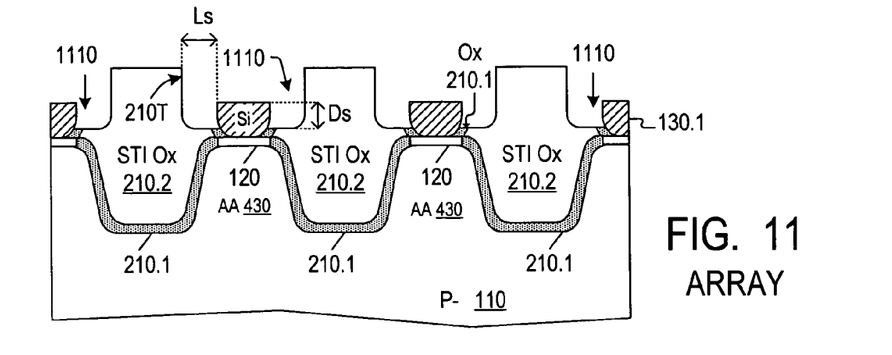

In FIG. 11, the top surface of oxide 210.2 is above the top surface of polysilicon 130.1 after the oxide etch, but this is not necessary. The top surface of oxide 210.2 may be even with, or below, the top surface of polysilicon 130.1.

The photoresist is removed from the periphery. Polysilicon layer 130.2 (FIG. 12A, memory array, and FIG. 12B, periphery) is deposited on the structure, and is doped during or after the deposition to the same conductivity type as the layer 130.1. Layer 130.2 will provide portions of the floating gates. Layer 130.2 extends into and fills the pockets 1110 (the regions from which the oxide 210.1, 210.2 was removed by the oxide etch of FIG. 11). An exemplary polysilicon deposition process is conformal low pressure chemical vapor deposition (LPCVD). The thickness of layer 130.2 (at least 2000 Å in some embodiments) is chosen to provide a planar top surface. The planar top surface is not necessary however.

Figure 12A:
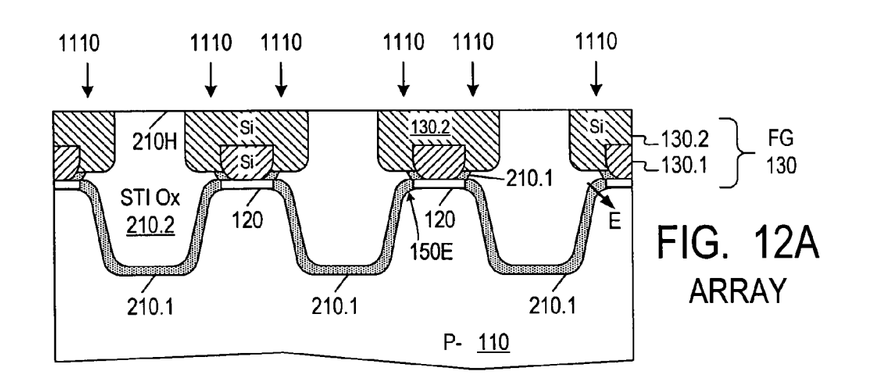
Figure 12B:
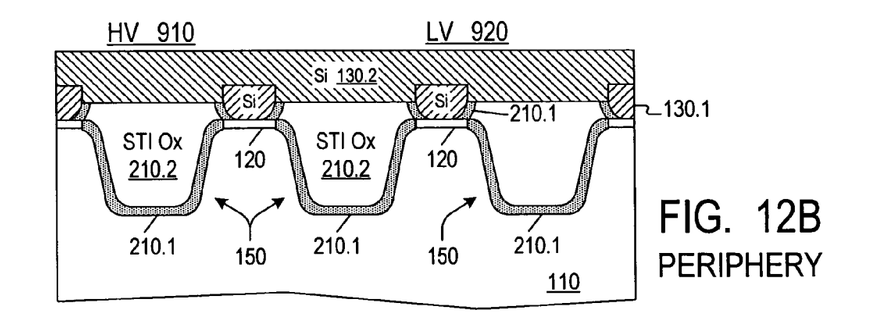
Figure 13:
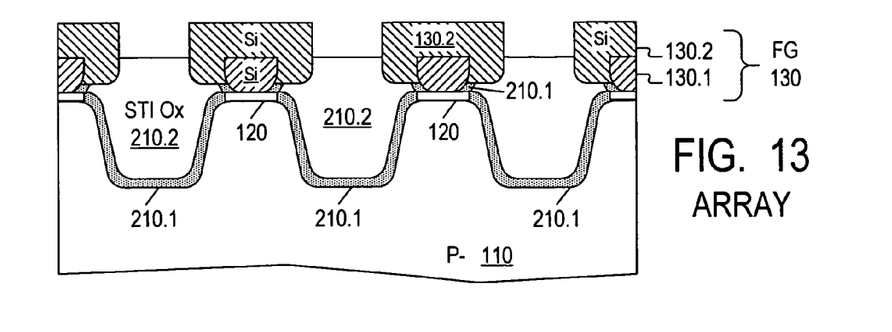
Figure 14:
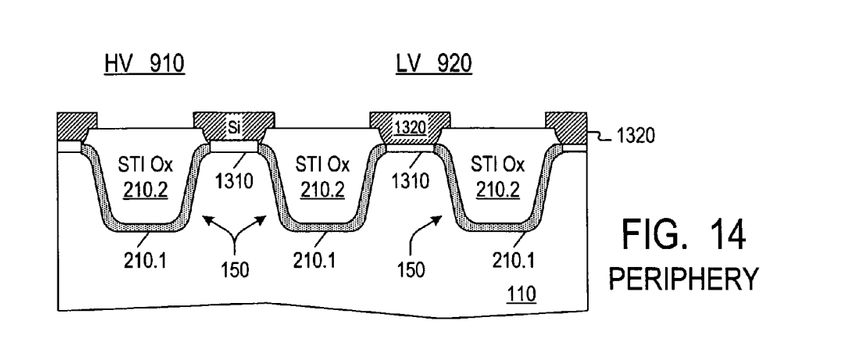

Layer 130.2 is subjected to CMP and/or an etch to remove the polysilicon 130.2 from over the top horizontal surfaces 210H of oxide features 210.2 and thus to isolate the floating gates of each column from the adjacent columns. Each floating gate will include the adjacent portions of layers 130.1, 130.2 that contact each other. In some embodiments, if the top surface of polysilicon 130.2 is not planar before the etch, it is planarized by depositing an auxiliary layer (e.g. photoresist) having a planar top surface and then etching the auxiliary layer and the polysilicon at equal etch rates. The top surface of layer 130.2 may be above, below, or even with the horizontal top surface 210H of oxide 210.2. In some embodiments, before the CMP, the periphery is masked with photoresist and the polysilicon is etched in the array area only; then the resist is removed and the CMP is conducted. This sequence aims to ensure that the polysilicon 130.2 is not polished away in the periphery by the CMP step. In some embodiments, polysilicon 130.2 is removed from the periphery during the CMP.

Pockets 1110 (FIG. 12A) cause the layer 130.2 to reach farther down towards the trench edges 150E and undesirably increase the electric field E at the trench edges. The rounded profile obtained at the trench edges during the formation of oxide 210.1 (FIG. 8) counteracts this disadvantage by reducing the electric field. This field is also reduced due to the oxidation of the bottom edges 130E of polysilicon 130.1 because the polysilicon oxidation increases the distance between the floating gates 130 and the trench edges. The oxidation of silicon edges 150E, 130E is facilitated by the lateral etch of oxide 120 (FIG. 7) due to a greater silicon area becoming exposed by the lateral oxide etch.

An optional etch of oxide 210.2 (FIG. 13) lowers the top surface of oxide 210 in the array area to a level below the top surface of polysilicon 130.2 to increase the capacitive coupling between the floating gates 130.1, 130.2 and the control gates 420 (FIG. 5B). See U.S. Pat. No. 6,355,524 issued Mar. 12, 2002 to Tuan et al. and incorporated herein by reference.

Figure 15:
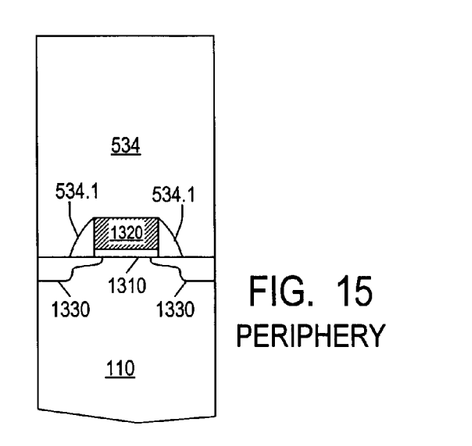

The memory fabrication can be completed using conventional techniques. In some embodiments, insulating layer 410 (FIGS. 5B, 5C) is formed over the structure. Layer 410 can be a sandwich of silicon dioxide, silicon nitride, silicon dioxide (ONO). A conductive layer 420 is deposited over ONO 410. Layer 420 can be doped polysilicon, polycide (doped polysilicon covered with a metal silicide), or some other conductive material. A dielectric layer (not shown) can optionally be formed on layer 420. Then the array is masked by photoresist (not shown), and layers 420, 410, 130.2, 130.1, 120 are removed from the peripheral area. Oxide 210.1 (FIG. 12B) covering the sidewalls of polysilicon 130.1 is also removed from the periphery. The photoresist is removed, and silicon dioxide 1310 (FIG. 14) is grown on the peripheral active areas on substrate 110. Oxide 1310 can be removed in the low voltage areas 920, and then re-grown in the low and high voltage areas, to provide a thicker oxide in high voltage areas 910 and a thinner oxide in low voltage areas 920. Polysilicon 1320 is deposited and patterned to form the peripheral transistor gates. Polysilicon 1320 is removed from the array area. A photoresist layer (not shown) is deposited to define the wordlines 420 (FIG. 5A). Layers 420, 410, 130.2, 130.1, 120 are etched in the array area as defined by the photoresist to form the wordlines and the floating gates and to expose the silicon substrate 120 in bitline regions 520B and source line regions 520S. N type dopant is implanted into these regions. Suitable doping is performed to form the source and drain regions 1330 (FIG. 15) for the peripheral PMOS and NMOS transistors. FIG. 15 shows a vertical cross section by a plane perpendicular to the plane of FIG. 14 and passing through a peripheral active area (this may be either a high voltage or a low voltage area). In the example of FIG. 15, regions 1330 are LDD (lightly doped drain) regions, formed by conventional techniques using dielectric spacers 534.1 on the sidewalls of gates 1320. Dielectric 534.1 is part of dielectric 534, and is not shown separately in FIG. 5C. Non-LDD structures are also possible. Formation of dielectric 534 is completed using suitable deposition techniques to provide a planar top surface in the array and peripheral areas. Contact openings 530 (FIG. 5C) are etched to bitline regions 520B. Other contact openings (not shown) are etched to the peripheral transistor regions. Tungsten plugs 524 are formed in the contact openings. A conductive layer 510 (e.g. polysilicon or metal) is deposited and patterned to form the bitlines.

The peripheral processing can be performed using many techniques, known or to be invented. For example, the peripheral transistor gates can be formed from layer 420. See also the aforementioned U.S. Pat. No. 6,355,524, and see U.S. patent application Ser. No. 10/772,520 filed Feb. 4, 2004 by Chua-Shun Hsiao et al. and incorporated herein by reference.

Figure 16:
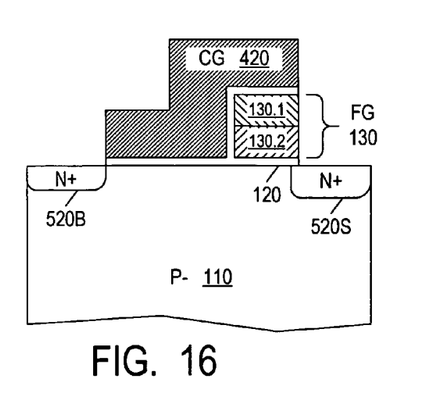
Figure 17A:
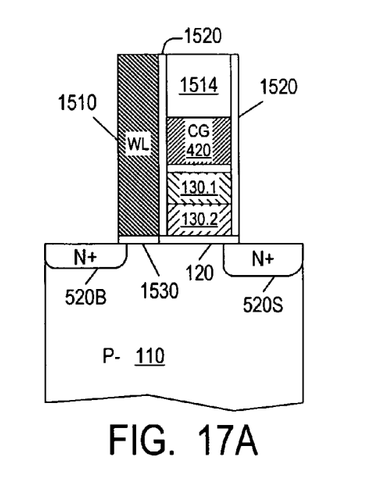
Figure 17B:
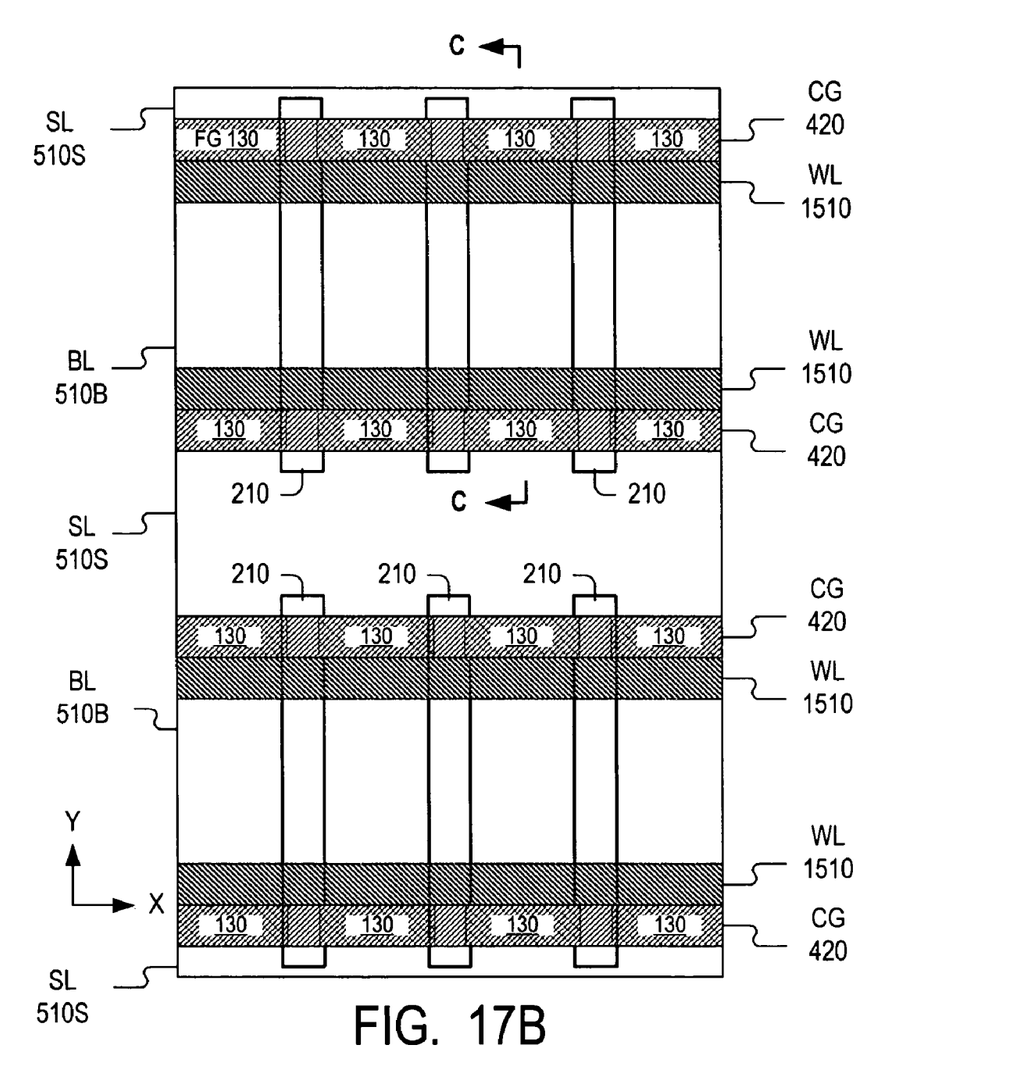
FIG. 17B is a top view of a memory structure fabricated according to one embodiment of the present invention.

The floating gate fabrication techniques described above can be incorporated into many memory structures, known or to be invented. Exemplary split-gate cell structures are shown in FIGS. 16, 17A, 17B. FIGS. 16, 17A illustrate the memory cross-sections passing through the control gates 420 between the trenches (such as cross section C-C in FIG. 5A). FIG. 16 illustrates a cell in which the layer 420 provides a control gate and a select gate.

FIG. 17A illustrates a cell in which the select gate is provided by a separate conductive layer 1510. This type of cell is described in the aforementioned U.S. Pat. No. 6,355,524. The top view of the memory array is shown in FIG. 17B. Line C—C in FIG. 17B marks the cross sectional plane of FIG. 17A. Layer 1514 is a dielectric deposited on wordline layer 420 before the wordlines are defined. Layers 1514, 420, 410, 130.2, 130.1 are then patterned as described above in connection with FIG. 5B. Then dielectric 1520 is formed over the sidewalls of each "row" structure defined as a structure formed by the layers 1514, 420, 410, 130.2, 130.1 in one memory row. The exposed portions of oxide 120 are etched away, and gate dielectric 1530 is formed on the exposed substrate areas for the select transistors. Doped polysilicon 1510 is conformally deposited and anisotropically etched to form wordlines. Each wordline provides the select gates for one row.

In some embodiments, the lateral etch of oxide 120 (FIG. 7) is performed before the trench-forming etch of substrate 110.

In some embodiments, the edges 130E (FIG. 7) of polysilicon 130.1 are not aligned directly above the trench edges 150E at the conclusion of the etch of substrate 110. For example, the edges 130E may be positioned above the active area away from the trenches. The etch of oxide 120 may remove the oxide at the trench edges, but the oxide etch does not necessarily etch the oxide under the polysilicon 130.1. The oxide etch may be a vertical etch having no lateral component. Alternatively, the edges polysilicon 130E and the underlying oxide 120 may overhang the trenches, and the subsequent etch of oxide 120 may remove the oxide at the edges polysilicon 130E but the oxide 120 may remain at the trench edges 150E.

The invention is not limited to the structures and methods described above. Each isolation trench 150 may run through the whole array, without terminating at source lines 520S. The source lines may go up and down traversing the isolation trenches, or individual source line regions 520S may be separated by the trenches and interconnected by a line formed above the substrate 120. See U.S. patent application Ser. No. 09/969,841 published as no. 2003-0068859 A1, incorporated herein by reference. The invention covers NAND memories and other array architectures, known or to be invented. The invention is not limited to any materials or fabrication processes. For example, floating gate layers 130.1, 130.2 can be formed from different materials. The top surface of layer 130.2 could be even with, or below, the top surface of layer 130.1. The invention is not limited to any memory programming or erase mechanisms. For example, the memory of FIGS. 5A–5C can be programmed by channel hot electron injection or Fowler-Nordheim tunneling of electrons from substrate 110 to floating gates 130, and erased by Fowler-Nordheim tunneling from the floating gates to the substrate. Other programming and erase mechanisms are also possible. Exemplary programming and erase mechanisms for the memory of FIGS. 17A, 17B are described in the aforementioned U.S. Pat. No. 6,355,524 and U.S. patent application Ser. No. 09/969,841. The invention includes both flash and non-flash memories. Other embodiments and variations are within the scope of the invention, as defined by the appended claims.

The invention claimed is:

1. A method for manufacturing an integrated circuit comprising one or more nonvolatile memory cells, each memory cell comprising at least one conductive floating gate, the method comprising:
   (1) forming a first dielectric on a semiconductor substrate;
   (2) forming a first layer on the first dielectric, the first layer to provide a first portion of each said floating gate;
   (3) removing portions of the first layer, the first dielectric, and the semiconductor substrate, to form one or more trenches in the semiconductor substrate, the one or more trenches being to provide isolation between active areas of the integrated circuit, the one or more trenches comprising one or more first edges, each first edge being an edge of an active area of a nonvolatile memory cell, wherein at a conclusion of this operation (3) the first dielectric is spaced from the one or more first edges;
   (4) forming a second dielectric in and over the one or more trenches adjacent to the first portions of the floating gates, wherein forming the second dielectric comprises thermally oxidizing the semiconductor substrate;
   (5) removing first portions of the second dielectric in first regions which are adjacent to the first edges of the trenches and are also adjacent to sidewalls of the first portions of the floating gates;
   (6) forming a second layer on the first layer to provide second portions of the floating gates, wherein the second portions of the floating gates extend into the first regions;

wherein the operation (3) comprises:
   (3A) patterning the first layer, the first dielectric, and the semiconductor substrate, to form the trenches; and
   (3B) after the patterning operation, etching the first dielectric at the first edges of the trenches selectively to the semiconductor substrate, to remove portions of the first dielectric under the edges of the first layer at the first edges of the trenches;

wherein at a conclusion of the etching of the first dielectric in the operation (3B), the semiconductor substrate has a first geometry at the first edges, the first geometry being defined by the semiconductor substrate's surface at the first edges; wherein the thermal oxidation of the semiconductor substrate in the operation (4) begins when the semiconductor substrate has the first geometry at the first edges, and the thermal oxidation in the operation (4) changes the first geometry to round the first edges of the trenches or to cause the first edges of the trenches to become more rounded.

2. The method of claim 1 wherein at the conclusion of the operation (3) the first layer has one or more edges adjacent to the first edges of the trenches, and the first dielectric is spaced from the edges of the first layer.

3. The method of claim 2 wherein the etching of the first dielectric in the operation (3B) removes portions of the first dielectric under the edges of the first layer at the first edges of the trenches.

4. The method of claim 1 wherein the patterning operation uses only one photolithographic mask.

5. The method of claim 1 wherein: after the operation (5), the second dielectric projects over the trenches;
   the method further comprises, after the operation (6), removing a portion of the second layer to cause the second layer's top surface to be substantially coplanar with the top of the second dielectric.

6. The method of claim 1 wherein the thermal oxidation in the operation (4) oxidizes one or more edges of the first layer adjacent to the first edges of the trenches.

7. The method of claim 1 wherein at least one of the trenches is to provide isolation for a peripheral circuit to be formed in a memory peripheral area of the integrated circuit, wherein the one or more trenches comprise one or more second edges, each second edge being an edge of an active area of the peripheral circuit, and at the conclusion of the operation (3) the first dielectric is spaced from the second edges of the trenches.

8. The method of claim 7 wherein the one or more trenches comprise one or more third edges, each third edge being an edge of an active area of the peripheral circuit, and at the conclusion of the operation (3) the first dielectric is not spaced from the third edges of the trenches.

9. The method of claim 8 wherein the second edges comprise edges of active areas of high voltage peripheral transistors, and the third edges comprise edges of active areas of low voltage peripheral transistors.

10. The method of claim 7 wherein the operation (3B) comprises etching the first dielectric at the second edges of the trenches selectively to the semiconductor substrate, to remove a portion of the first dielectric at the second edges of the trenches.

11. The method of claim 10 wherein:
at a conclusion of the etching of the first dielectric in the operation (3B), the semiconductor substrate has a second geometry at the second edges, the second geometry being defined by the semiconductor substrate's surface at the second edges: and
the thermal oxidation in the operation (4) begins when the semiconductor substrate has the second geometry at the second edges, and the thermal oxidation in the operation (4) changes the first geometry to round the second edges of the trenches or to cause the second edges to become more rounded.

12. The method of claim 7 wherein the second edges of the trenches are the edges of one or more active areas of one or more peripheral transistors.

13. The method of claim 12 wherein the transistors are high voltage transistors used to generate one or more high voltages for changing a state of one or more of the memory cells.

14. An integrated circuit manufacturing method comprising:
(1) forming a first dielectric on a semiconductor substrate;
(2) forming a first layer on the first dielectric, the first layer to provide at least a first portion of a conductive floating gate for a nonvolatile memory cell;
(3) removing portions of the first layer, the first dielectric, and the semiconductor substrate, to form a trench in the semiconductor substrate, wherein at a conclusion of this operation (3) the first dielectric is spaced from an edge of the first layer adjacent to a first edge of the trench, the first edge also being an edge of an active area of the memory cell; and
(4) forming a second dielectric in and over the trench adjacent to the first portion of the floating gate, wherein forming the second dielectric comprises thermally oxidizing the edge of the first layer;
wherein the operation (3) comprises:
(3A) patterning the first layer, the first dielectric, and the semiconductor substrate to form the trench;
(3B) after the patterning operation, etching the first dielectric under the edge of the first layer selectively to the first layer;
wherein at a conclusion of the etching of the first dielectric in the operation (3B), the first layer has a first edge geometry at said edge of the first layer, the first edge geometry being defined by the first layer's surface at said edge of the first layer;
wherein the thermal oxidation of the edge of the first layer in the operation (4) begins when the first layer has the first edge geometry at said edge, and the thermal oxidation in the operation (4) changes the first edge geometry to round said edge or to cause said edge to become more rounded.

15. The method of claim 14 wherein the removing operation comprises removing a portion of the first dielectric under the first portion of the floating gate adjacent to the edge of the first layer.

16. The method of claim 14 wherein the first layer provides the first portion of the floating gate but not a second portion of the floating gate, and the method further comprises:
(5) removing a first portion of the second dielectric in a first region which is adjacent to the edge of the first layer and is also adjacent to a sidewall of the first portion of the floating gate;
(6) forming a second layer on the first layer to provide the second portion of the floating gate, wherein the second portion of the floating gate extends into the first region.

17. The method of claim 16 wherein the patterning operation uses only one photolithographic mask.

18. The method of claim 16 wherein:
after the operation (5), the second dielectric projects over the trench;
the method further comprises, after the operation (6), removing a portion of the second layer to cause the second layer's top surface to be substantially coplanar with the top of the second dielectric.

19. The method of claim 1 wherein the thermal oxidation of the semiconductor substrate in the operation (4) comprises Rapid Thermal Oxidation (RTO).

20. The method of claim 14 wherein the thermal oxidation of the edge of the first layer in the operation (4) comprises Rapid Thermal Oxidation (RTO).

* * * * *